US009096931B2

(12) United States Patent
Yednak, III et al.

(10) Patent No.: US 9,096,931 B2
(45) Date of Patent: Aug. 4, 2015

(54) DEPOSITION VALVE ASSEMBLY AND METHOD OF HEATING THE SAME

(75) Inventors: Andrew M. Yednak, III, Phoenix, AZ (US); Todd Dunn, Cave Creek, AZ (US); Carl White, Gilbert, AZ (US); Michael Manasco, Tempe, AZ (US)

(73) Assignee: ASM America, Inc, Phoenix, AZ (US)

( * ) Notice: Subject to any disclaimer, the term of this patent is extended or adjusted under 35 U.S.C. 154(b) by 208 days.

(21) Appl. No.: 13/312,591

(22) Filed: Dec. 6, 2011

(65) Prior Publication Data

US 2013/0104992 A1  May 2, 2013

Related U.S. Application Data

(63) Continuation-in-part of application No. 13/283,408, filed on Oct. 27, 2011.

(51) Int. Cl.
F16K 49/00 (2006.01)
C23C 16/455 (2006.01)
F16K 27/00 (2006.01)

(52) U.S. Cl.
CPC ..... *C23C 16/45561* (2013.01); *C23C 16/45512* (2013.01); *F16K 27/003* (2013.01); *F16K 49/002* (2013.01); *Y10T 137/0318* (2015.04); *Y10T 137/6416* (2015.04); *Y10T 137/6606* (2015.04); *Y10T 137/7036* (2015.04)

(58) Field of Classification Search
CPC ............ C23C 16/45512; F16K 49/002; Y10T 137/6606; Y10T 137/7036

USPC .................. 137/334, 341, 375, 884; 118/715; 219/531

See application file for complete search history.

(56) References Cited

U.S. PATENT DOCUMENTS

| | | | |
|---|---|---|---|
| 2,745,640 | A | 5/1956 | Cushman |
| 2,990,045 | A | 9/1959 | Root |
| 3,833,492 | A | 9/1974 | Bollyky |
| 3,854,443 | A | 12/1974 | Baerg |
| 3,862,397 | A | 1/1975 | Anderson et al. |
| 3,887,790 | A | 6/1975 | Ferguson |
| 4,058,430 | A | 11/1977 | Suntola et al. |
| 4,176,630 | A | 12/1979 | Elmer |
| 4,194,536 | A | 3/1980 | Stine et al. |
| 4,389,973 | A | 6/1983 | Suntola et al. |

(Continued)

FOREIGN PATENT DOCUMENTS

| | | |
|---|---|---|
| CN | 1563483 A | 12/2006 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Kevin Murphy
(74) *Attorney, Agent, or Firm* — Snell & Wilmer LLP

(57) ABSTRACT

A valve assembly including a mounting block having a first surface, a plurality of valves connected to the mounting block first surface, at least one fluid line connecting the plurality of valves spaced apart from the mounting block first surface, a heating element spaced apart from the at least one fluid line and located within a first insulating layer, and wherein the first insulating layer extends less than completely around the at least one fluid line.

19 Claims, 8 Drawing Sheets

(56) References Cited

U.S. PATENT DOCUMENTS

| | | |
|---|---|---|
| 4,393,013 A | 7/1983 | McMenamin |
| 4,436,674 A | 3/1984 | McMenamin |
| 4,570,328 A | 2/1986 | Price et al. |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,827,430 A | 5/1989 | Aid et al. |
| 4,882,199 A | 11/1989 | Sadoway et al. |
| 4,991,614 A | 2/1991 | Hammel |
| 5,062,386 A | 11/1991 | Christensen |
| 5,119,760 A | 6/1992 | McMillan et al. |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,326,427 A | 7/1994 | Jerbic |
| 5,380,367 A | 1/1995 | Bertone |
| 5,595,606 A | 1/1997 | Fujikawa et al. |
| 5,632,919 A * | 5/1997 | MacCracken et al. ........ 219/494 |
| 5,681,779 A | 10/1997 | Pasch et al. |
| 5,730,801 A | 3/1998 | Tepman et al. |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,837,320 A | 11/1998 | Hampden-Smith et al. |
| 5,855,680 A | 1/1999 | Soininen et al. |
| 5,920,798 A | 7/1999 | Higuchi et al. |
| 5,979,506 A | 11/1999 | Aarseth |
| 6,013,553 A | 1/2000 | Wallace |
| 6,015,465 A | 1/2000 | Kholodenko et al. |
| 6,035,101 A | 3/2000 | Sajoto et al. |
| 6,060,691 A * | 5/2000 | Minami et al. ................ 219/201 |
| 6,074,443 A | 6/2000 | Venkatesh |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,161,500 A | 12/2000 | Kopacz et al. |
| 6,201,999 B1 | 3/2001 | Jevtic |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,372,583 B1 | 4/2002 | Tyagi |
| 6,383,566 B1 | 5/2002 | Zagdoun |
| 6,410,459 B2 | 6/2002 | Blalock et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,521,295 B1 | 2/2003 | Remington |
| 6,534,395 B2 | 3/2003 | Werkhoven et al. |
| 6,569,239 B2 | 5/2003 | Arai et al. |
| 6,579,833 B1 | 6/2003 | McNallan et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,633,364 B2 | 10/2003 | Hayashi |
| 6,648,974 B1 | 11/2003 | Ogliari et al. |
| 6,673,196 B1 | 1/2004 | Oyabu |
| 6,682,973 B1 | 1/2004 | Paton et al. |
| 6,709,989 B2 | 3/2004 | Ramdani et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 6,955,836 B2 | 10/2005 | Kumagai et al. |
| 6,972,478 B1 | 12/2005 | Waite et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,298,009 B2 | 11/2007 | Yan et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,437,060 B2 | 10/2008 | Wang et al. |
| 7,442,275 B2 | 10/2008 | Cowans |
| 7,489,389 B2 | 2/2009 | Shibazaki et al. |
| 7,547,363 B2 | 6/2009 | Tomiyasu et al. |
| 7,575,968 B2 | 8/2009 | Sadaka et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| 7,651,583 B2 | 1/2010 | Kent et al. |
| D614,153 S | 4/2010 | Fondurulia et al. |
| 7,720,560 B2 | 5/2010 | Menser et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 | 12/2010 | Tuominen et al. |
| 7,884,918 B2 | 2/2011 | Hattori |
| 8,041,197 B2 | 10/2011 | Kasai et al. |
| 8,055,378 B2 | 11/2011 | Numakura |
| 8,071,451 B2 | 12/2011 | Berry |
| 8,071,452 B2 | 12/2011 | Raisanen |
| 8,072,578 B2 | 12/2011 | Yasuda et al. |
| 8,076,230 B2 | 12/2011 | Wei |
| 8,076,237 B2 | 12/2011 | Uzoh |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,367,528 B2 | 2/2013 | Bauer et al. |

(56) References Cited

U.S. PATENT DOCUMENTS

| | | |
|---|---|---|
| 8,444,120 B2 | 5/2013 | Gregg et al. |
| 8,506,713 B2 | 8/2013 | Takagi |
| 8,608,885 B2 | 12/2013 | Goto et al. |
| 8,683,943 B2 | 4/2014 | Onodera et al. |
| 8,711,338 B2 | 4/2014 | Liu et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| 8,877,655 B2 | 11/2014 | Shero et al. |
| 8,883,270 B2 | 11/2014 | Shero et al. |
| 8,986,456 B2 | 3/2015 | Fondurulia et al. |
| 8,993,054 B2 | 3/2015 | Jung et al. |
| 9,005,539 B2 | 4/2015 | Halpin et al. |
| 2001/0017103 A1 | 8/2001 | Takeshita et al. |
| 2001/0046765 A1 | 11/2001 | Cappellani et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0098627 A1 | 7/2002 | Pomarede et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0094133 A1* | 5/2003 | Yoshidome et al. ........... 118/715 |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0023516 A1 | 2/2004 | Londergan et al. |
| 2004/0036129 A1 | 2/2004 | Forbes et al. |
| 2004/0077182 A1 | 4/2004 | Lim et al. |
| 2004/0106249 A1 | 6/2004 | Huotari |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1* | 10/2005 | Hoshi et al. ................... 137/341 |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068125 A1 | 3/2006 | Radhakrishnan |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1* | 10/2006 | Bertram et al. ................. 216/59 |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054405 A1 | 3/2007 | Jacobs et al. |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0248310 A1 | 10/2008 | Kim et al. |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |

(56) References Cited

U.S. PATENT DOCUMENTS

| | | |
|---|---|---|
| 2009/0261331 A1 | 10/2009 | Yang et al. |
| 2009/0277510 A1* | 11/2009 | Shikata ................. 137/334 |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2013/0023129 A1 | 1/2013 | Reed |
| 2013/0104988 A1 | 5/2013 | Yednak et al. |
| 2013/0115383 A1 | 5/2013 | Lu et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0004316 A1 | 1/2015 | Thompson et al. |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |

FOREIGN PATENT DOCUMENTS

| | | |
|---|---|---|
| CN | 101522943 | 9/2009 |
| CN | 101423937 A | 9/2011 |
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | I226380 | 1/2005 |
| TW | 200701301 A | 1/2007 |
| WO | 2006/056091 A1 | 6/2006 |
| WO | 2006/078666 | 7/2006 |
| WO | 2010118051 | 10/2010 |
| WO | 2011019950 | 2/2011 |
| WO | 2013078065 | 5/2013 |
| WO | 2013078066 | 5/2013 |

OTHER PUBLICATIONS

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Notice of Allowance dated Jun. 16, 2011 in U.S. Appl. No. 12/430,751.

USPTO; Notice of Allowance dated Jul. 27, 2011 in U.S. Appl. No. 12/430,751.

PCT; International Search report and Written Opinion dated Nov. 12, 2010 in Application No. PCT/US2010/030126.

PCT; International Preliminary Report on Patentability dated Oct. 20, 2011 in Application No. PCT/US2010/030126.

PCT; International Search report and Written Opinion dated Jan. 12, 2011 in Application No. PCT/US2010/045368.

Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.

Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.

USPTO; Office Action dated Jan. 15, 2013 in U.S. Appl. No. 12/754,223.

USPTO; Office Action dated Feb. 26, 2013 in U.S. Appl. No. 12/754,223.

PCT; International Search report and Written Opinion dated Feb. 6, 2013 in Application No. PCT/US2012/065343.

PCT; International Search report and Written Opinion dated Feb. 13, 2013 in Application No. PCT/US2012/065347.

USPTO; Office Action dated Dec. 6, 2012 in U.S. Appl. No. 12/854,818.

USPTO; Office Action dated Jan. 10, 2013 in U.S. Appl. No. 13/339,609.

USPTO; Office Action dated Feb. 11, 2013 in U.S. Appl. No. 13/339,609.

Chinese Patent Office; Office Action dated Jan. 10, 2013 is Serial No. 201080015699.9.

Novaro et al. Theoretical Study on a Reaction Pathway of Ziegler-Natta-Type Catalysis, J. Chem. Phys. 68(5), Mar. 1, 1978 p. 2337-2351.

USPTO; Final Office Action dated Jun. 28, 2013 in U.S. Appl. No. 12/754,223.

USPTO; Office Action dated Feb. 25, 2014 in U.S. Appl. No. 12/754,223.

USPTO; Final Office Action dated Jul. 14, 2014 in U.S. Appl. No. 12/754,223.

USPTO; Office Action dated Apr. 23, 2013 in U.S. Appl. No. 12/763,037.

(56) References Cited

OTHER PUBLICATIONS

USPTO; Final Office Action dated Oct. 21, 2013 in U.S. Appl. No. 12/763,037.
USPTO; Restriction Requirement dated Sep. 25, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Notice of Allowance dated Jul. 3, 2014 in U.S. Appl. No. 13/102,980.
USPTO; Non-Final Office Action dated Jul. 2, 2014 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Office Action dated Jul. 31, 2014 in U.S. Appl. No. 13/411,271.
USPTO; Restriction Requirment dated Oct. 29, 2013 in U.S. Appl. No. 13/439,528.
USPTO; Office Action dated Feb. 4, 2014 in U.S. Appl. No. 13/439,528.
USPTO Final Office Action dated Jul. 8, 2014 in U.S. Appl. No. 13/439,528.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Office Action dated Jun. 2, 2014 in U.S. Appl. No. 13/677,151.
USPTO; Office Action dated Apr. 24, 2014 in U.S. Appl. No. 13/784,362.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Restriction Requirement dated May 8, 2014 in U.S. Appl. No. 13/791,246.
USPTO; Office Action dated May 29, 2014 in U.S. Appl. No. 14/183,187.
Chinese Patent Office; Notice on the First Office Action dated May 24, 2013 in Application No. 201080036764.6.
Chinese Patent Office; Notice on the Second Office Action dated Jan. 2, 2014 in Application No. 201080036764.6.
Chinese Patent Office; Notice on the Third Office Action dated Jul. 1, 2014 in Application No. 201080036764.6.
Chinese Patent Office; Notice on the First Office Action dated Feb. 8, 2014 in Application No. 201110155056.
Japanese Patent Office; Office Action dated Jan. 25, 2014 in Application No. 2012-504786.
Taiwan Patent Office; Office Action dated Jul. 4, 2014 in Application No. 099110511.
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.

(56) References Cited

OTHER PUBLICATIONS

USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTa1-xN Alloys of Rocksalt Structure. Journal of Applied Physics, 110, pp. 043535-1-043535-6, (2011).
USPTO; Final Office Action dated Apr. 15, 2015 in U.S. Appl. No. 13/187,300.
USPTO; Final Office Action dated Mar. 13, 2015 in U.S. Appl. No. 13/597,043.
USPTO; Non-Final Office Action dated Apr. 3, 2015 in U.S. Appl. No. 13/677,133.
USPTO; Notice of Allowance dated Mar. 10, 2015 in U.S. Appl. No. 13/874,708.
USPTO; Final Office Action dated Mar. 25, 2015 in U.S. Appl. No. 13/791,246.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Fina. Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology a 21.5, (2003): S88-S95.
Varma, et al., "Effect of Mtal Halides on Thermal, Mechanical, and Electrical Properties of Polypyromelitimide Films," Journal of Applied Polymer Science, vol. 32, pp. 3987-4000, (1986).

\* cited by examiner

DEPOSITION VALVE ASSEMBLY AND METHOD OF HEATING THE SAME

INCORPORATION BY REFERENCE

This application claims priority to U.S. patent application Ser. No. 13/283,408 entitled "HEATER JACKET FOR A FLUID LINE" to Yednak III et al., filed on Oct. 27, 2011, the disclosure of which is hereby incorporated herein by reference in its entirety.

FIELD OF THE INVENTION

This disclosure relates generally to semiconductor processing, and more particularly to a valve assembly having an improved temperature control system for semiconductor processing fluid lines.

BACKGROUND

Semiconductor fabrication processes are typically conducted with the substrates supported within a chamber under controlled conditions. For many purposes, semiconductor substrates (e.g., wafers) are heated inside the process chamber. For example, substrates can be heated by direct physical contact with an internally heated wafer holder or "chuck." "Susceptors" are wafer supports used in radiantly heated systems where the wafer and susceptors absorb radiant heat.

Some of the important controlled conditions include, but are not limited to, fluid flow rate into the chamber, temperature of the reaction chamber, temperature of the fluid flowing into the reaction chamber, and temperature of the fluid throughout the fluid line.

In order to obtain a consistent reaction environment, maintaining the correct flow rate of precursor at a correct temperature is among the key factors. However, the importance of maintaining the temperature of the precursors at a uniform temperature is not limited to just the reaction chamber. A number of precursors have a limited temperature range of gaseous phase composition. Thus, in order to maintain the correct flow rate, the precursor must be maintained within a slim temperature range from the source container, through the fluid line, and finally into the reaction chamber.

A number of heater jackets have been developed in an attempt to maintain consistent fluid temperatures during the transition from the temperature controlled source container to the reaction chamber. One common example is cloth heater jackets which surround the fluid line and include a cloth inner layer in contact with the fluid line. The cloth heater jacket may be generally flexible but wear easily. An alternative to heater jackets includes heat tape, which is inexpensive but time consuming to install on fluid lines. Further, when a section of the fluid line needs to be worked on or replaced, the heat tape must be removed, scraped, and a new section installed in its place.

Precursor valve assemblies also present a number of heating challenges due to their compact nature and exposed fluid line connections between each of the valve members or bodies.

SUMMARY

Various aspects and implementations are disclosed herein that relate to valve assembly designs and methods of heating a fluid line in a valve assembly. In one aspect, a valve assembly comprises a mounting block having a first surface, a plurality of valves connected to the mounting block first surface, at least one fluid line connecting the plurality of valves spaced apart from the mounting block first surface, a heating element spaced apart from the at least one fluid line and located within a first insulating layer, and wherein the first insulating layer extends less than completely around the at least one fluid line.

In an implementation, the heating element may be positioned adjacent the at least one fluid line. The valve assembly may further include a second insulating layer spaced apart from the heating element and between the at least one fluid line and the mounting block first surface. The first insulating layer and the second insulating layer may together surround the at least one fluid line. The heating element may radiantly heat the at least one fluid line. The first insulating layer may further include a recessed portion positioned at each of the at least one fluid lines.

The valve assembly may further include a second heating element separate from the heating element. The heating element may be encapsulated within a recessed portion of the first insulating layer. The recessed portion may be encapsulated with a silicone rubber. The first insulating layer may be positioned between the plurality of valves. The valve assembly may further include a secondary insulator positioned on the first insulating layer. The secondary insulator may include three separable layers. The secondary insulator may further include a plurality of apertures adapted to receive the plurality of valves. The first insulating layer may be composed of a high density foam. The first insulating layer may further include a first upper insulating layer and a second insulating layer. The first upper insulating layer may further include a first heating element and the second upper insulating layer may further include a second heating element. The first heating element and the second heating element may be configured to be separately controlled. The heating element may radiantly heat the at least one fluid line only within the recessed portion.

In another aspect, a method of heating a fluid line in a valve assembly comprises the steps of providing a first insulating layer having a heating element spaced apart and surrounding less than all of the at least one fluid line, surrounding the at least one fluid line between the first insulating layer and the valve block, and powering the heating element to radiantly heat an area between the first insulating layer and the valve block and the at least one fluid line.

In yet another aspect, a valve assembly includes a mounting block having a mounting surface, a plurality of valves connected to the mounting block mounting surface, at least one fluid line in fluid communication with the plurality of valves above the mounting block mounting surface, a heating element positioned above the at least one fluid line and located within an upper insulating layer, and wherein the upper insulating layer extends less than completely around the at least one fluid line.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

Figure 1:
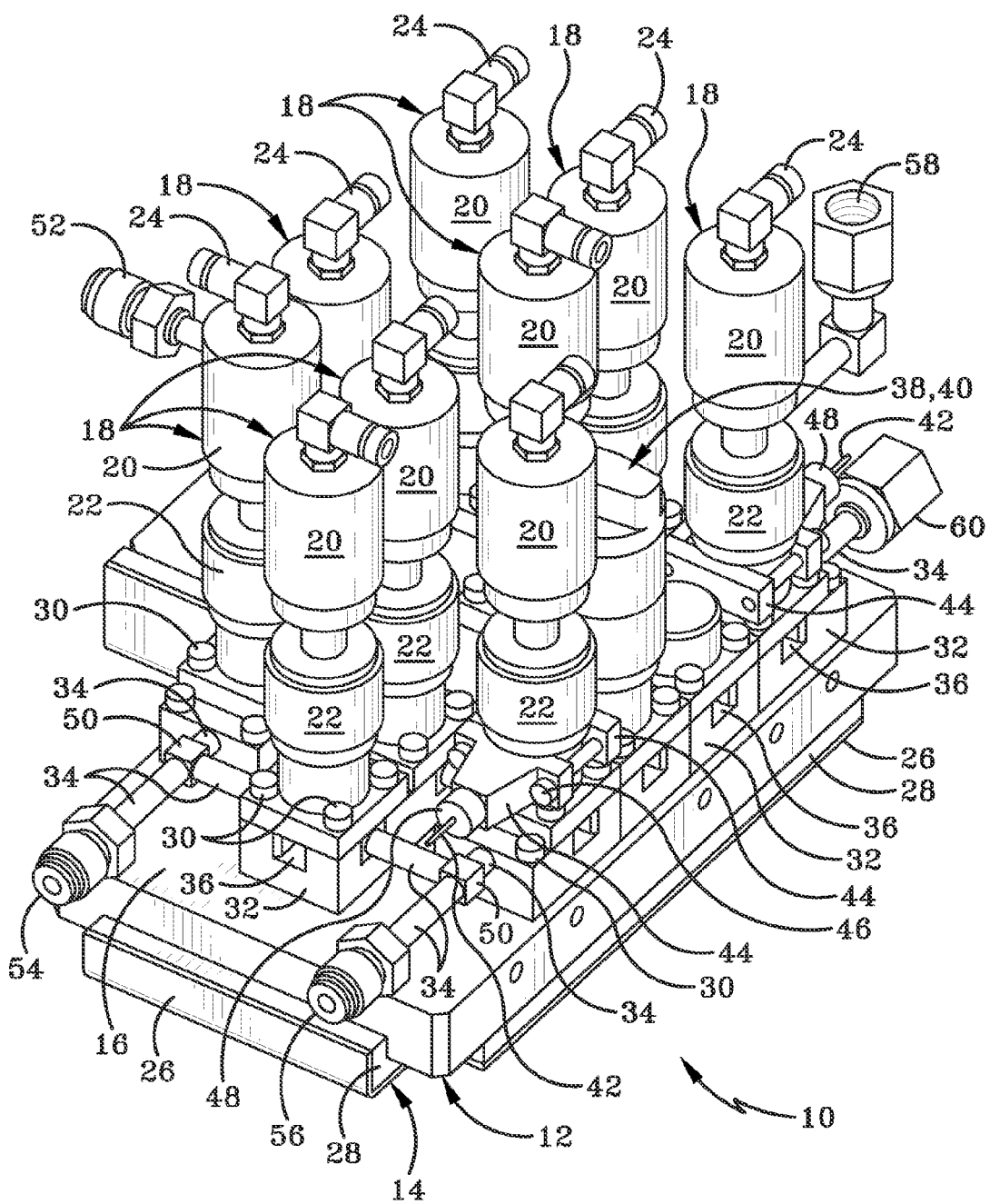
FIG. 1 is a perspective view of a valve assembly mounted on a heated valve block.

FIG. 1 illustrates a deposition valve assembly 10 having a mounting block 12 resting on an isolation unit 14. Mounting block 12 may be a typical valve assembly mounting device with an integral heater (not shown) for maintaining a steady temperature in the various valves. Mounting block 12 also includes a first surface 16 for receiving one or more deposition valves 18. Deposition valves 18 may include an upper chamber 20 and a lower chamber 22. The upper chamber may include a pneumatically actuated spring-biased apparatus controlling a bypass valve within lower chamber 22 for controlling fluid flow through each valve and the valve assembly as a unit. The spring biased apparatus is controlled by air flow through air inlet 24.

Isolation unit 14 may include a rigid outer surface 26 composed of aluminum, stainless steel, or any other suitable material and an isolation sheet 28 composed of a high density foam or other suitable material. Isolation unit 14 is used to not only protect the valve assembly from damage due to shock or vibration, but also acts to thermally isolate the valve assembly and the remainder of the tool As discussed above, mounting block 12 serves as a base unit for supporting the valve assembly while also providing heat to the valves. Valves 18 are oriented at a right angle with respect to first surface 16 (or top surface in FIG. 1) and secured to the first surface with bolts 30 through cradles 32. Cradles 32 may be composed of aluminum, stainless steel, or any other suitable material and are generally u-shaped to permit fluid lines 34 to pass through the u-shaped openings 36 in cradles 32 as well as locate seals (not shown) between the fluid line interconnection and the valves 18.

Valve assembly 10 may also include a manual adjustment valve 38 having an adjustment knob 40 which can be used as a needle valve to regulate flow throughout the valve assembly.

Valve assembly 10 may also include a pair of thermocouples 42 to measure the outer surface temperature of at least two valves. Thermocouples 42 are connected to the respective valves with clamps 44 secured around valves 18 with bolts 46. The thermocouples 42 are connected to clamps 44 through thermocouple mounts 48 and the clamps may include through holes (not shown) which permit the thermocouple probes to be positioned directly adjacent or in contact with the valve 18 outer surfaces for more accurate temperature readings and temperature control.

Referring still to FIG. 1, fluid lines 34 may be composed of stainless steel or any other suitable material which is process, temperature, and pressure resistant. At several points along the length of fluid lines 34 junction boxes 50 may be utilized to fluidly connect two, three, four, or more fluid lines.

A carrier or purge line inlet 52 is positioned upstream from a carrier or purge line outlet 54 and a precursor or processing fluid inlet 56. Further, a process vacuum inlet 58 may be located on the valve assembly. Carrier line inlet 52 is in fluid communication with the precursor fluid inlets and permits the appropriate mixing of the carrier fluid and the precursor fluids. In one non-limiting example, the carrier fluid may be a nitrogen gas or an argon gas. After proper mixing within the valve assembly, the fluid exits valve assembly 10 at reactor outlet 60 and is directed to the reaction chamber for a deposition or etch process, as appropriate.

Figure 2:
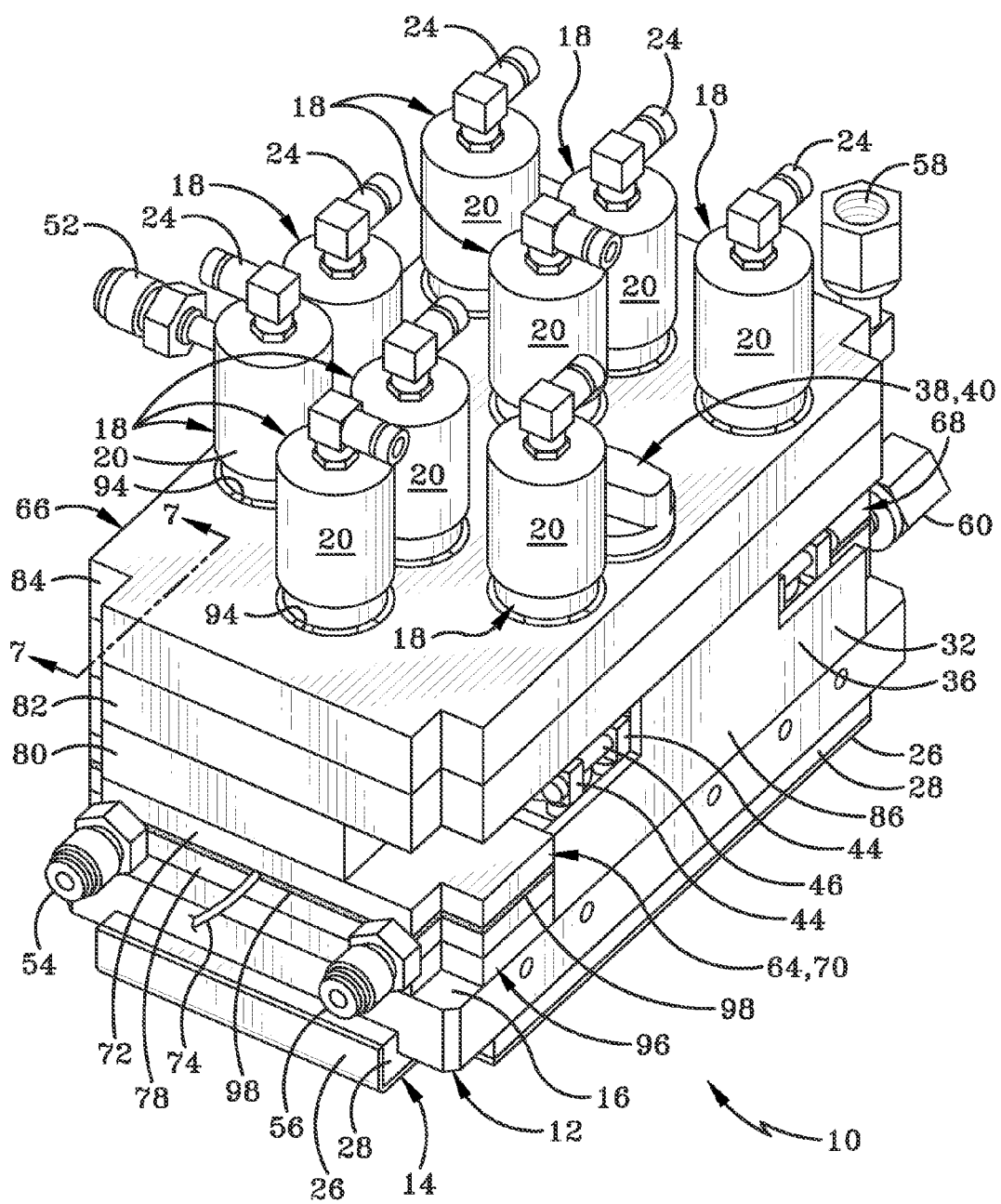
FIG. 2 is a perspective view of a valve assembly according to an embodiment of the present disclosure.

FIG. 2 illustrates deposition valve assembly 10 having a fluid line heating assembly 64 and an insulator assembly 66 mounted to valve assembly 10. Fluid line heating assembly 64 is preferably installed adjacent mounting block 12 and is used to assist in maintaining a consistent fluid temperature throughout the valve assembly and particularly as the carrier fluids and precursor fluids pass through the fluid lines 34 between each of the deposition valves 18 within the deposition valve assembly 10. Insulator assembly 66 may be positioned on the opposite side of fluid line heating assembly 64 from mounting block 12 to also assist in maintaining a consistent temperature throughout valve assembly 10 and fluid lines 34. Specifically, insulator assembly 66 assists in maintaining a consistent temperature throughout deposition valve assembly by reducing heat loss radiating away from deposition valves 18 and fluid lines 34. Not only does insulator assembly 66 reduce heat loss within the valve assembly, the insulator assembly also reduces the load on the various heating elements within the deposition valve assembly.

Figure 3:
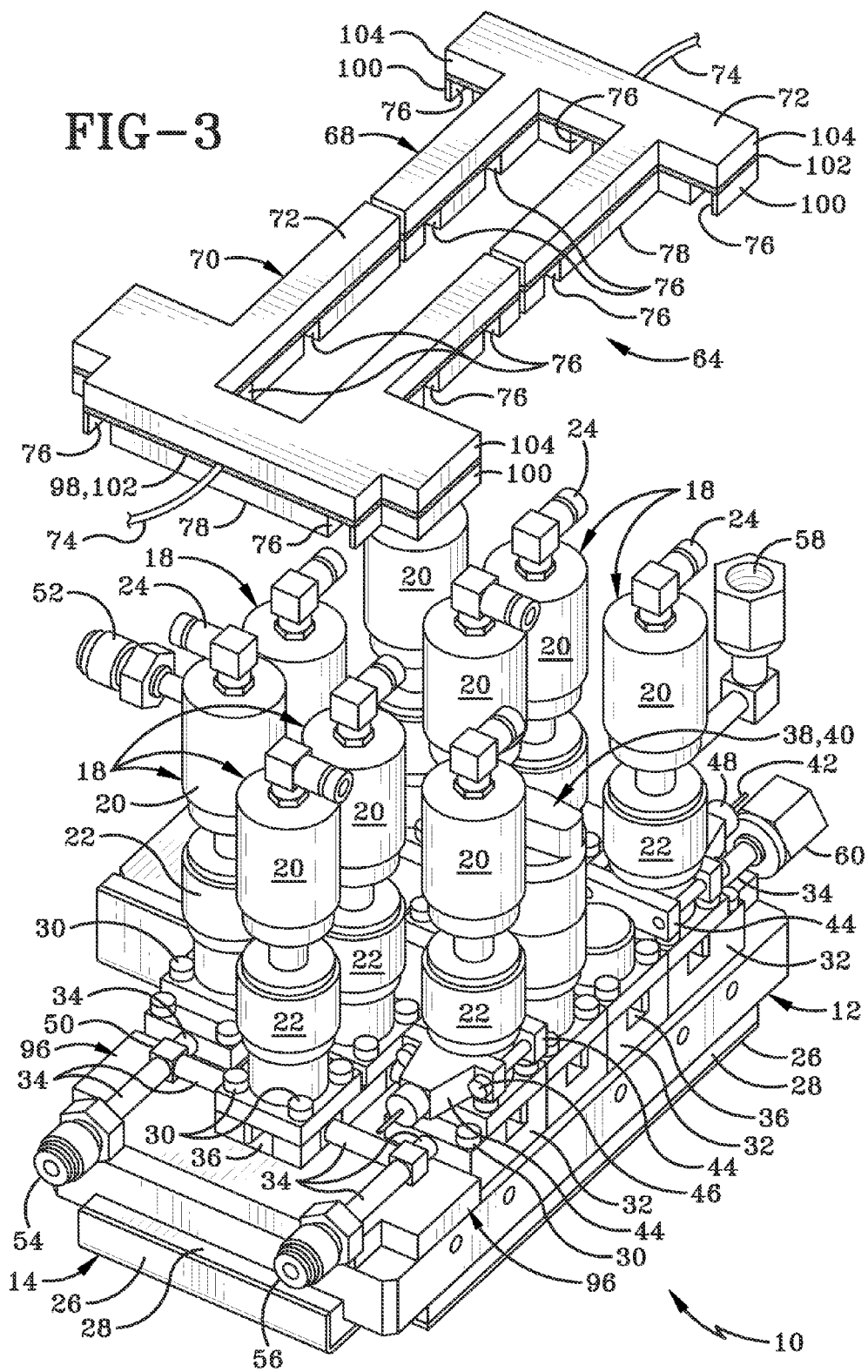
FIG. 3 is a perspective view of a partially exploded valve assembly according to an embodiment of the present disclosure.

FIG. 3 illustrates an exploded view of fluid line heating assembly 64 removed from deposition valve assembly 10. In one aspect, fluid line heating assembly 64 may include a first fluid line heating unit 68 and a second fluid line heating unit 70. Each of the first and second fluid line heating units may be oriented to cover one-half of the deposition valve assembly 10 or any other suitable combination of the valve assembly so long fluid lines 34 are each covered by a fluid line heating unit to maintain the temperature therein.

As can be further seen in FIG. 3, a top surface 72 of both first fluid line heating unit 68 and second fluid line heating unit 70 may be smooth or flat to receive insulator assembly 66 and evenly maintain the fluid line heating assembly 64 temperature. Further, each fluid line heating unit includes a heating element 74 extending inward that can each be separately controlled from a remote location. The fluid line heating units may also include a plurality of recessed portions 76 formed in a bottom surface 78. As will be discussed in greater detail below, each recessed portion 76 is aligned to surround and positioned adjacent a fluid line 34 which is exposed or outside of a cradle 32 and/or deposition valves 18. Throughout this detailed description, the term fluid line and fluid are used to encompass any liquid, gas, or solid and are not intended, nor should they be interpreted to limit the type, composition, or state of any liquid, solid, gas, or combination thereof that may be utilized within the spirit and scope of the disclosure and the claims.

Figure 4:
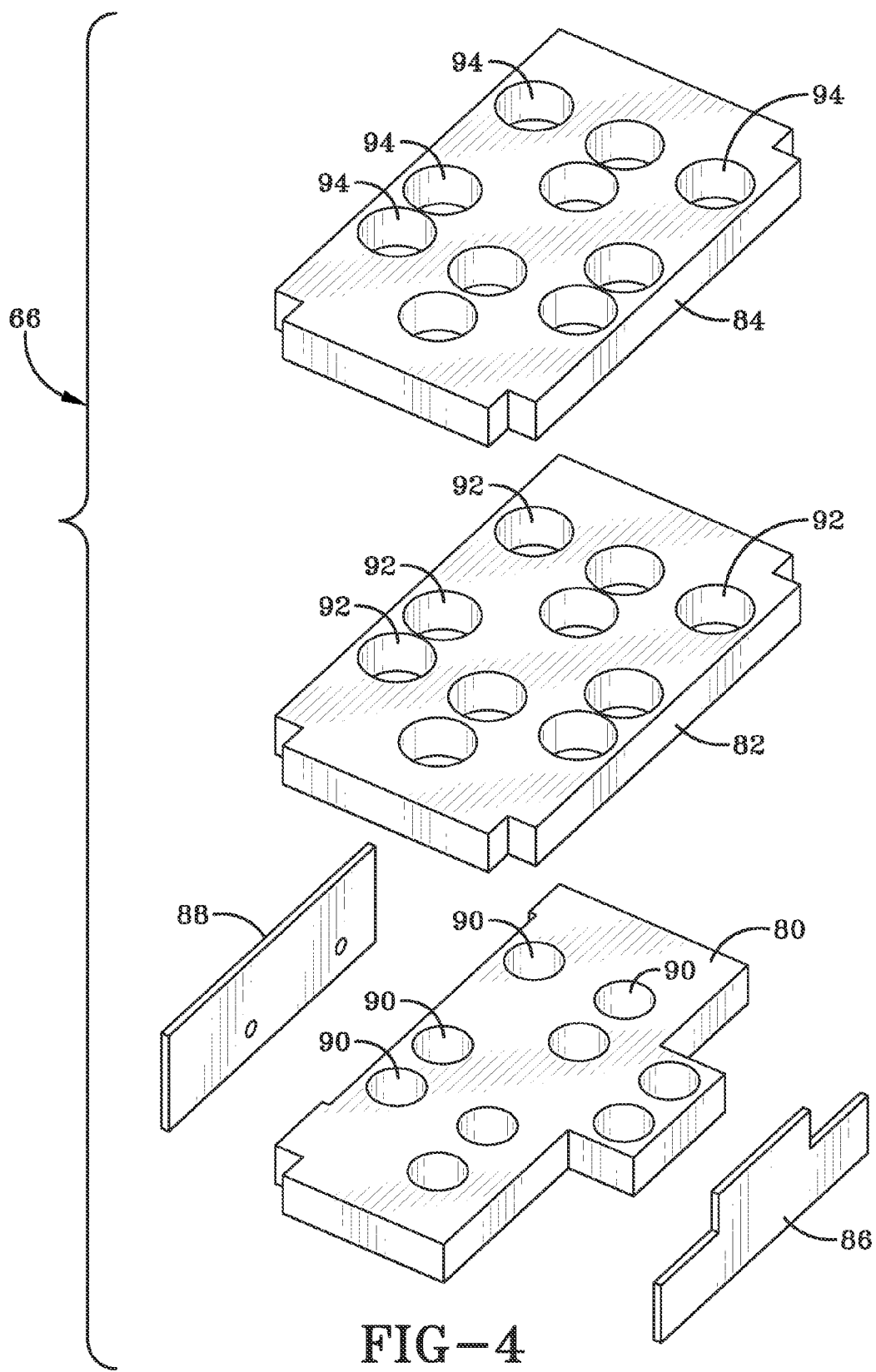
FIG. 4 is a perspective view of an exploded valve assembly secondary insulating layer according to an embodiment of the present disclosure.

FIG. 4 illustrates an enlarged exploded view of insulator assembly 66 (or secondary insulator) having a first secondary insulator layer 80, a second secondary insulator layer 82, and third secondary insulator layer 84. The insulator layers may be separable from one another or secured together with an adhesive or other suitable fastening method. A first side support 86 and a second side support 88 may be placed on opposing sidewalls of the insulator assembly 66 to assist with positioning and holding the insulator assembly in position. The first and second side supports 86, 88 may be composed of a metal, a sponge material (such as silicone foam), or any other suitable material known within the art as will be readily apparent.

First secondary layer 80 includes a plurality of apertures 90 strategically placed along a horizontal surface of the layer and extending throughout the full thickness of the first secondary layer. Similarly, second secondary layer 82 includes a plurality of apertures 92 extending throughout the thickness of the second secondary layer and the third secondary layer 84 includes a plurality of apertures 94 extending throughout the thickness of the third secondary layer. Advantageously, all three layers of the insulator assembly 66 are aligned with one another and with respect to deposition valves 18. The three secondary insulation layers 80, 82, and 84 are each aligned to permit the apertures to surround the lower chamber 22 of each deposition valve 18. Accordingly, this arrangement reduces heat loss to the surrounding environment.

Secondary insulation layers 80, 82, and 84 are each approximately ½" thick sponge or high density material, such as silicone foam. While the particular material and dimensions utilized are provided purely for this exemplary non-limiting embodiment, one of ordinary skill in the art will immediately realize that any suitable material and dimensions may be utilized without departing from the spirit and scope of the disclosure.

Referring now to FIG. 3, a second insulating layer 96 is shown installed between deposition valves 18 and specifically below fluid lines 34. Second insulating layer 96 may be composed of a high density foam, such as silicone foam, or any other suitable material that can assist in retaining heat while simultaneously acting as a seal. In operation, second insulating layer 96 may be installed before deposition valves 18 and may be specially designed and oriented to the particular valve orientation located on mounting block 12. Thus it is seen that any orientation or arrangement of deposition valves 18 may be constructed and a similar second insulating layer 96 may be utilized. Further, although second insulating layer 96 is shown and described as a single piece, any number of layers may be incorporated, including multiple layers stacked atop one another or various single layers abutting one another on mounting block 12.

Still further, second insulating layer 96 is preferably dimensioned to fit below fluid lines 34 during operation. In many embodiments, second insulating layer 96 may be installed on mounting block 12 prior to cradles 32 and deposition valves 18. Nevertheless, the second insulating layer 96 may be installed after the cradles 32 and deposition valves 18 in other embodiments. Regardless of when installed, second insulating layer 96 is preferably positioned just below fluid lines 34 when fully installed so as to provide a small air gap between fluid lines 34 and the second insulating layer 96.

Figure 5:
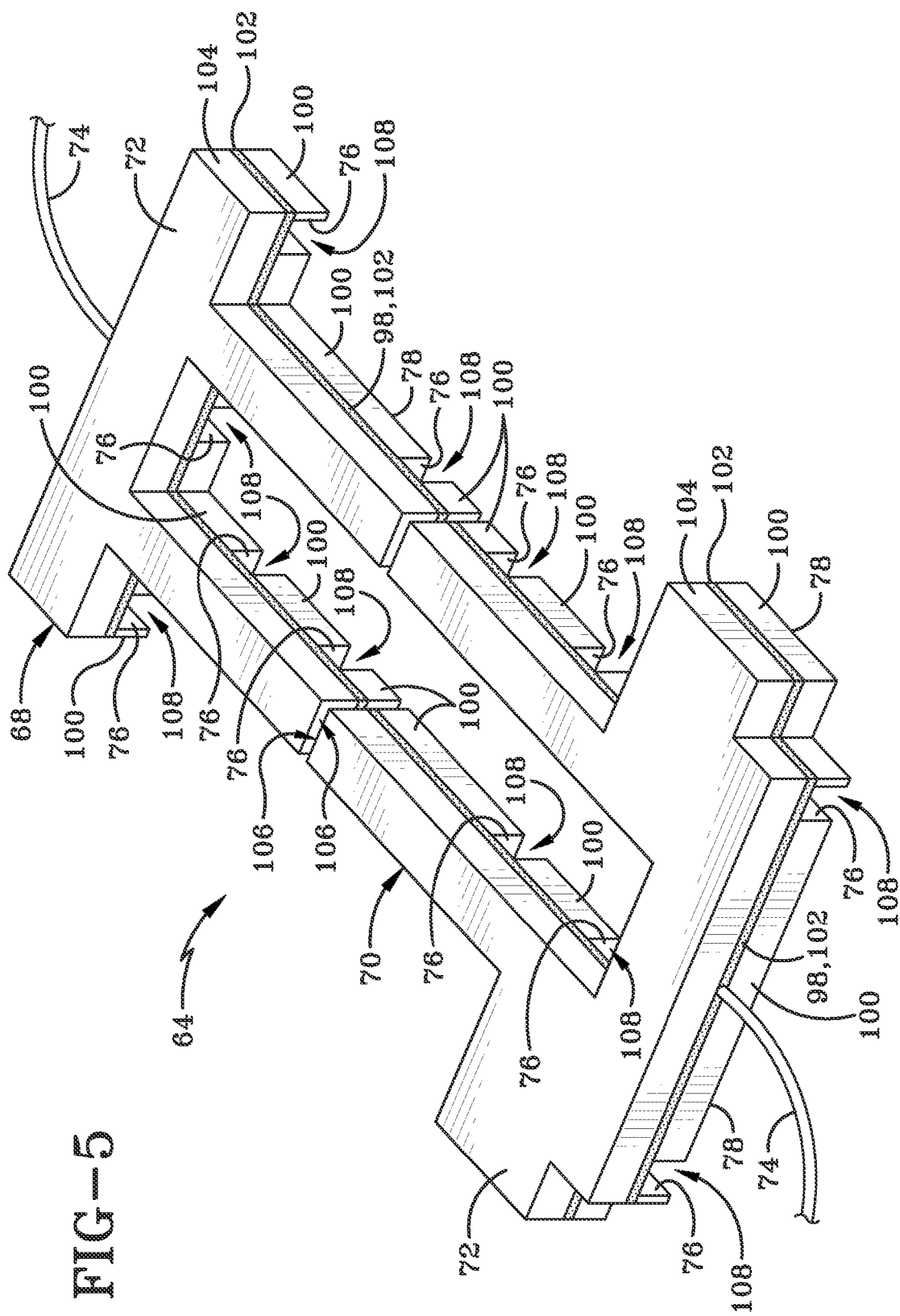
FIG. 5 is a perspective view of a pair of first insulating layers removed from the valve assembly according to an embodiment of the present disclosure.
Figure 6:
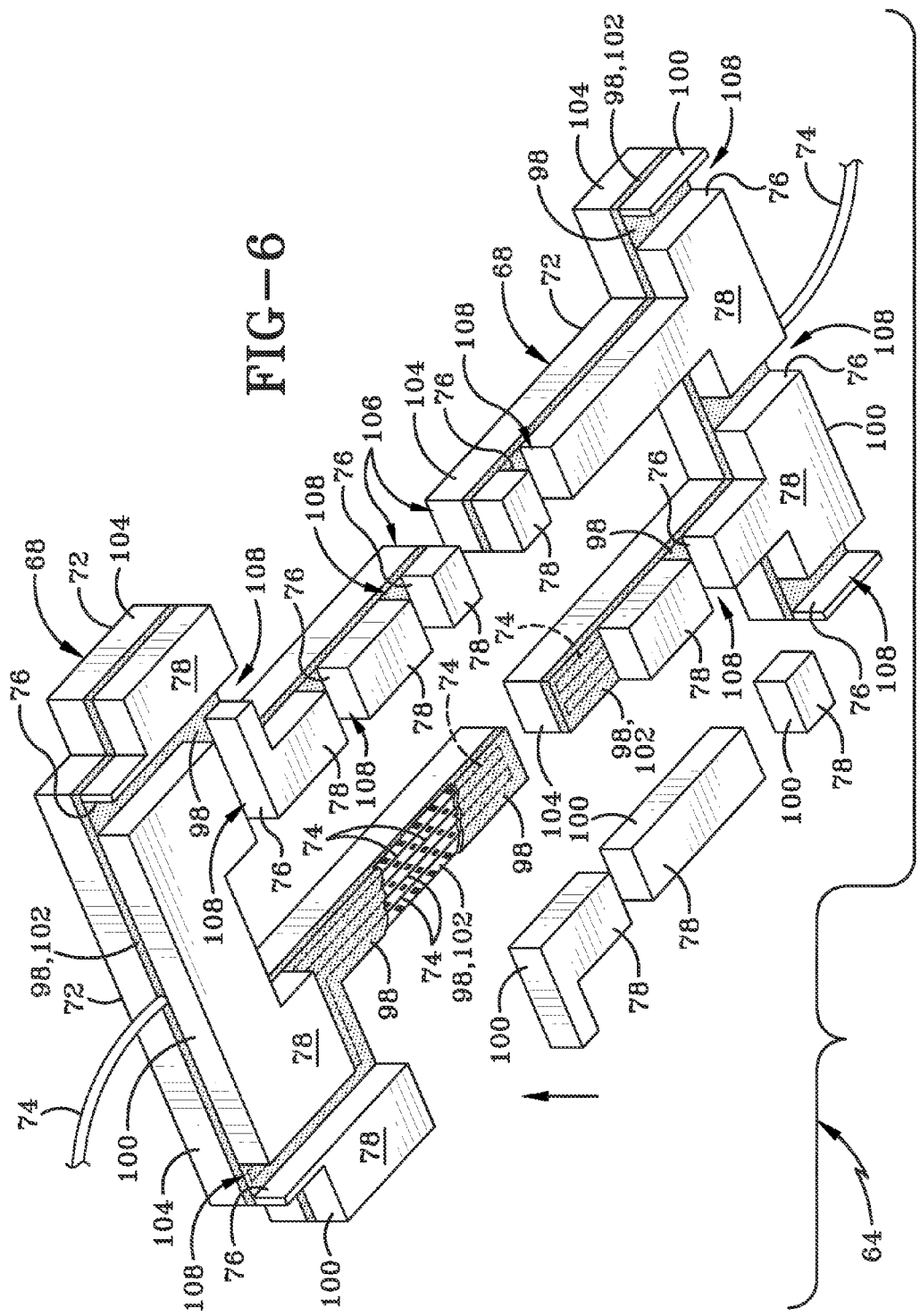
FIG. 6 is a perspective view of a partially exploded valve assembly first insulating layer of the valve assembly according to an embodiment of the present disclosure.

Referring now to FIGS. 5 and 6, first heating unit 68 and second heating unit 70 are shown removed from the deposition valve assembly 10. As can be better seen in these two views, the first and second heating units 68, 70 include a plurality of recessed portions 76 which directly expose an intermediate layer 98 which may be an encapsulated rubber, such as silicone rubber or any other suitable material known in the art. In one aspect, each heating unit may include a first substrate 100, a third substrate 104, and a second substrate 102 positioned between the first and third substrates. The substrates combined also include inner ends 106 which meet with respective inner ends from the other heating unit in this non-limiting example. In one non-limiting example, the first and third substrates 100 and 104 are each composed of a silicone or other high density foam, while the second substrate is a rubber, such as silicone rubber. In an alternative embodiment, the first and second heating units 68, 70 may be a single piece of high density foam with recessed portions 76 removed from the bottom surface 78 and heating element 74 exposed only at the top of the recessed portions, which may then be encapsulated with a silicone rubber or other suitable material. The proposed examples are purely for the purpose of explaining the scope and breadth of the disclosure and are in no way to be viewed as limiting the claims.

Further, the recessed portions 76 are oriented in both an X and Y plane as, in this particular non-limiting example; there are a plurality of fluid lines 34 which are exposed as they traverse both directions. Each labeled recessed portion 76 provides heating to a fluid line 34 which includes at least a portion that is not located within a cradle 32 or below a deposition valve 18. For the sake of clarity, each recessed portion provides direct radiant heat to a fluid line which would otherwise not be directly heated without the respective heating unit and heating element 74. Accordingly, while the particular orientation and arrangement of the recessed portions is applicable to this non-limiting example, any number and orientation of recessed portions may be utilized to provide radiant or convection heating to the exposed fluid lines. Further, the shape and positioning of each heating until 68, 70 may be modified or adapted based on the deposition valve orientation and positioning. For example, three or four different heating units may be utilized and may each include their own heating elements 74 disposed therein for heating the respective fluid lines 34. Further, a single heating unit may be utilized and include only a single heating element 74 or a plurality of heating elements disposed throughout the heating unit.

Figure 7:
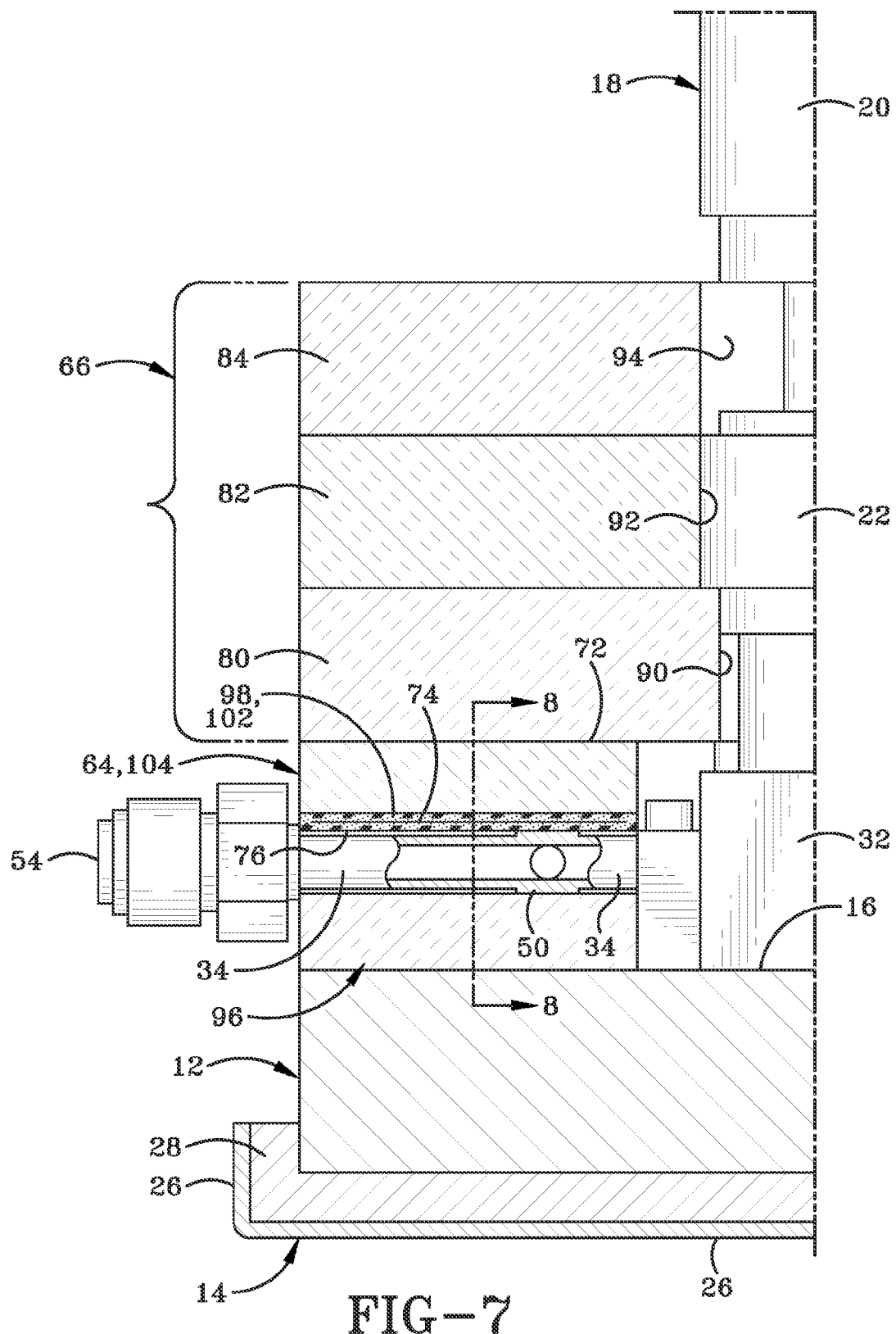
FIG. 7 is a cross-sectional view of the valve assembly according to an embodiment of the present disclosure taken generally about line 7-7 in FIG. 2.
Figure 8:
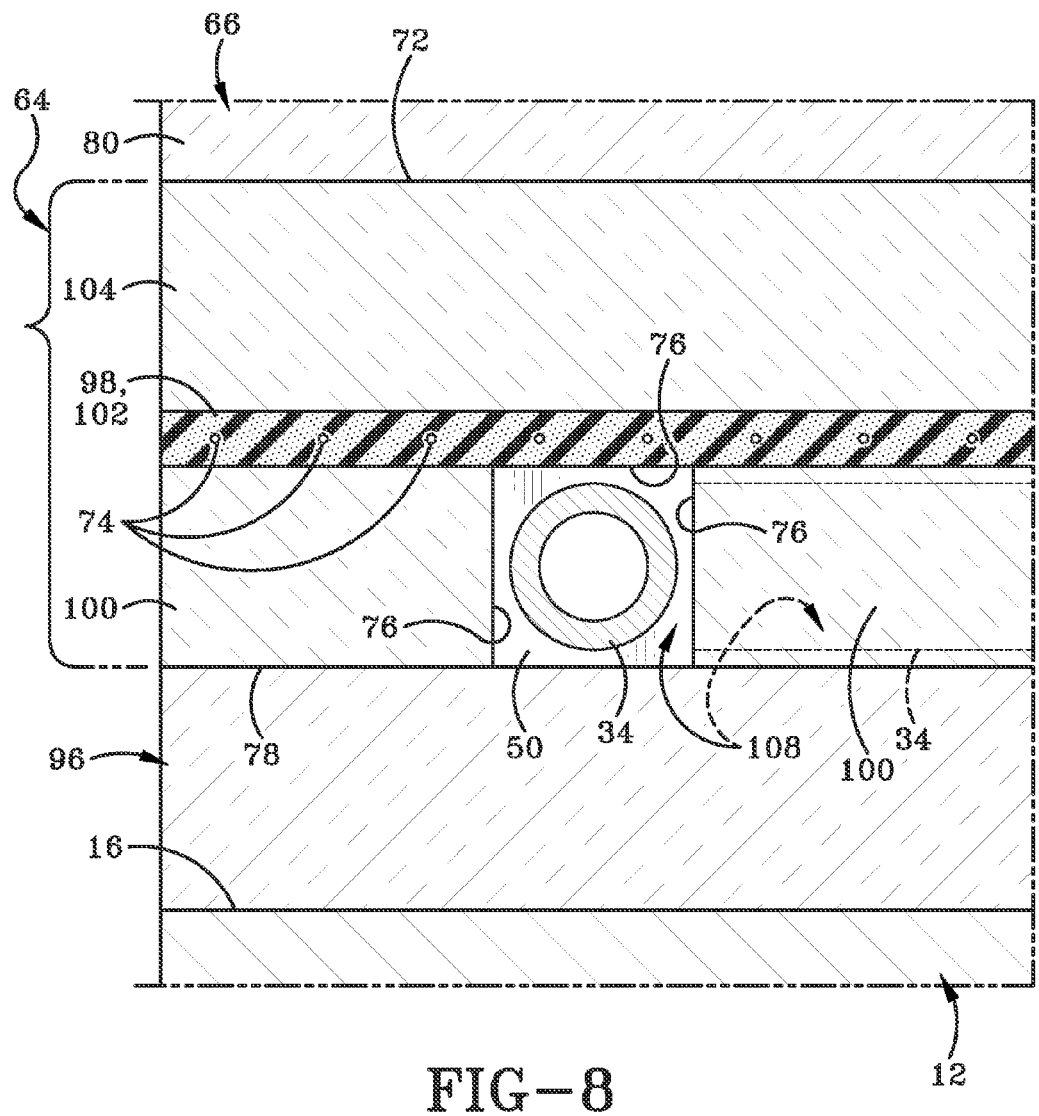
FIG. 8 is a cross-sectional view of the valve assembly according to an embodiment of the present disclosure taken generally about line 8-8 in FIG. 7.

FIGS. 7 and 8 illustrate assembled views of the deposition valve assembly with the heating units and various insulation layers in place. As particularly seen in FIG. 7, junction boxes 50, as applicable, of the various fluid lines 34 may function to create gaps or spaces 108 around the remaining portions of fluid lines 34. In another implementation, junction boxes 50 may not be present and a generally rigid first and second heating units create the gaps or spaces 108 around fluid lines 34.

In one non-limiting example, recessed portions 76 of heating unit 68 and 70 are generally deep enough to create three sides (top side and two sidewalls) around each fluid line and extends less than completely around fluid lines 34. Further, because the heating units 68, 70 are resting adjacent and/or on second insulating layer 96, the bottom side is occupied by the second insulating layer 96. Accordingly, the recessed portions 76 of the heating units 68, 70 together with the second insulating layer 96 effectively together surround each of the fluid lines 34 when fully assembled. As can be seen in FIG. 8, heating element 74 is positioned within second substrate 102 and provides radiant or convection heating to the fluid lines 34 during operation to maintain the fluid lines at the desired temperature, which can range from as low as room temperature up to 200 degrees C. or beyond. Specifically, the air gaps between recessed portion 76 and second insulating layer 96 permit the mounting block 12 with heating element (not shown) and the heating element 74 within the second substrate to heat the space and/or air directly surrounding the fluid line 34 to reduce hot spots on the fluid line 34 and provide for a more consistent precursor fluid and carrier fluid within the valve assembly. Thus, the valve assembly can more efficiently and precisely transfer the precursor to the reaction chamber.

As discussed above, in one non-limiting example, a mounting block 12 is provided with a heating element therein and the second insulating layer 96 may be installed thereon. A plurality of deposition valves 18 and fluid lines 34 interconnecting the deposition valves 18 may be provided on mounting block 12. An insulator unit 64 may include installing a first heating unit 68 and potentially a second heating unit assembly 70, each having a heating element 74, over fluid lines 34 such that the heating units surround less than all of each of the fluid lines 34 with recessed portions 76. Once fully installed, the first and second heating units 68, 70 in combination with the second insulating layer 96 completely surround each fluid line 34 where recessed portions 76 are located. The heating elements 74 are each separately controlled (i.e. heating element within first heating unit 68 is separately controlled from heating element within second heating unit 70) in one aspect, or the heating elements may be actuated by a single controller, depending on the desired outcome. Still further, since at least one thermocouple 42 may be located within each zone covered by a heating unit, the controller for each heating unit 68, 70 heating element 74 may be programmed to control the temperature at each thermocouple. The above discussion is merely exemplary and a person of skill in the art will immediately recognize that a variety of modifications can be achieved without departing from the spirit and scope of the detailed description.

These and other embodiments for methods and apparatus for a valve assembly to maintain efficient heating may incorporate concepts, embodiments, and configurations as described with respect to embodiments of apparatus for valve assemblies described above. The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

What is claimed is:

1. A valve assembly comprising:
   a mounting block having a first surface;
   a plurality of valves connected to the mounting block first surface;
   a plurality of fluid lines, wherein at least one fluid line couples two of the plurality of valves spaced apart from the mounting block first surface;
   a heating element located within a first insulating layer and overlying the plurality of fluid lines and the mounting block, wherein the plurality of fluid lines are between the mounting block and the heating element, and
   a second insulating layer adjacent the first insulating layer and between the at least one fluid line and the mounting block first surface,
   wherein the plurality of fluid lines are between the first insulating layer and the second insulating layer, and
   wherein the first insulating layer extends over a portion and less than completely around the at least one fluid line.

2. The valve assembly of claim 1 wherein the heating element is positioned adjacent the at least one fluid line.

3. The valve assembly of claim 1 further comprising an air gap between a recessed portion of the first insulating layer and the second insulating layer.

4. The valve assembly of claim 1 wherein the first insulating layer and the second insulating layer together surround the at least one fluid line.

5. The valve assembly of claim 1 wherein the heating element radiantly heats the at least one fluid line.

6. The valve assembly of claim 1 wherein the first insulating layer further comprises a recessed portion positioned at each of the at least one fluid lines.

7. The valve assembly of claim 1 further comprising a second heating element separate from the heating element.

8. The valve assembly of claim 1 wherein the heating element is encapsulated within a recessed portion of the first insulating layer.

9. The valve assembly of claim 8 wherein the recessed portion is encapsulated with a silicone rubber.

10. The valve assembly of claim 1 wherein the first insulating layer is positioned between the plurality of valves.

11. The valve assembly of claim 10 further comprising a secondary insulator positioned on the first insulating layer.

12. The valve assembly of claim 11 wherein the secondary insulator comprises three separable layers.

13. The valve assembly of claim 11 wherein the secondary insulator further comprises a plurality of apertures adapted to receive the plurality of valves.

14. The valve assembly of claim 1 wherein the first insulating layer is composed of a high density foam.

15. The valve assembly of claim 1 wherein the first insulating layer further comprises a first upper insulating layer and a second upper insulating layer.

16. The valve assembly of claim 15 wherein the first upper insulating layer further comprises a first heating element and the second upper insulating layer further comprises a second heating element.

17. The valve assembly of claim 16 wherein the first heating element and the second heating element are configured to be separately controlled.

18. The valve assembly of claim 1 wherein the heating element directly radiantly heats the at least one fluid line within a recessed portion of the first insulating layer.

19. A valve assembly comprising:
- a processing fluid inlet;
- a carrier line located upstream and in fluid communication with the processing fluid inlet to allow mixing of a carrier fluid and a precursor fluid within the valve assembly;
- a mounting block having a mounting surface;
- a plurality of valves connected to the mounting block mounting surface;
- a plurality of fluid lines, wherein at least one fluid line is in fluid communication with two of the plurality of valves above the mounting block mounting surface; and
- a heating element located within a first insulating layer and overlying the plurality of fluid lines and the mounting block,
- wherein the plurality of fluid lines are between the mounting block and the heating element;
- a second insulating layer adjacent the first insulating layer and between the at least one fluid line and the mounting block,
- wherein the plurality of fluid lines are between the first insulating layer and the second insulating layer, and
- wherein the first insulating layer extends over a portion and less than completely around the at least one fluid line.

* * * * *